United States Patent
Aoyagi et al.

(10) Patent No.: US 10,206,289 B2
(45) Date of Patent: Feb. 12, 2019

(54) PRINTED CIRCUIT BOARD, METHOD FOR MANUFACTURING PRINTED CIRCUIT BOARD, AND METHOD FOR JOINING CONDUCTIVE MEMBER

(71) Applicant: TATSUTA ELECTRIC WIRE & CABLE CO., LTD., Osaka (JP)

(72) Inventors: Yoshihiko Aoyagi, Kyoto (JP); Yoshinori Kawakami, Osaka (JP); Yoshio Hirano, Kyoto (JP); Kiyotaka Urashita, Kyoto (JP); Ryota Fujikawa, Kyoto (JP); Nobuhiro Fujio, Kyoto (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 0 days.

(21) Appl. No.: 15/522,207

(22) PCT Filed: Oct. 29, 2015

(86) PCT No.: PCT/JP2015/080615
§ 371 (c)(1),
(2) Date: Apr. 26, 2017

(87) PCT Pub. No.: WO2016/068260
PCT Pub. Date: May 6, 2016

(65) Prior Publication Data
US 2017/0325338 A1    Nov. 9, 2017

(30) Foreign Application Priority Data
Oct. 29, 2014 (JP) ................................ 2014-220867

(51) Int. Cl.
*B23K 31/02* (2006.01)
*H05K 3/34* (2006.01)
(Continued)

(52) U.S. Cl.
CPC ........... *H05K 3/3494* (2013.01); *B23K 1/005* (2013.01); *B23K 1/0016* (2013.01); *H05K 3/34* (2013.01);
(Continued)

(58) Field of Classification Search
CPC ........... H05K 3/3494; H05K 2203/049; H05K 2203/0147; B23K 1/005; B23K 1/0053;
(Continued)

(56) References Cited

U.S. PATENT DOCUMENTS 4,547,652 A * 10/1985 Raisig .................. B23K 1/0056
219/121.63
4,978,835 A * 12/1990 Luijtjes ................ B23K 1/0056
219/121.64

(Continued)

FOREIGN PATENT DOCUMENTS

| JP | 07066238 | 3/1995 |
|---|---|---|
| JP | 08148256 | 6/1996 |
| JP | 5479432 B2 | 4/2014 |

OTHER PUBLICATIONS

International Search Report dated Nov. 24, 2015 filed in PCT/JP2015/080615.

*Primary Examiner* — Kiley S Stoner
(74) *Attorney, Agent, or Firm* — Rankin, Hill & Clark LLP

(57) ABSTRACT

Soldering is performed with a high yield ratio even when extremely-thin wires are joined at an extremely-narrow pitch. Moreover, a bridge between conductive joint portions is reduced. A core wire 41 is placed on a preliminarily-soldered conductive joint portion 2. Then, the conductive joint portions 2 and the core wires 41 are covered with an optically-transparent sheet 30. Thus, the state in which the core wire 41 is placed on the conductive joint portion 2 is held. In this state, the optically-transparent sheet 30 is (Continued)

irradiated with light. A preliminary solder 3 is heated and melted to join the core wire 41 and the conductive joint portion 2 together.

9 Claims, 4 Drawing Sheets

(51) Int. Cl.
    *B23K 1/00*     (2006.01)
    *B23K 1/005*     (2006.01)
    *B23K 101/42*     (2006.01)
(52) U.S. Cl.
    CPC ............... *B23K 2101/42* (2018.08); *H05K 2201/10287* (2013.01); *H05K 2203/0147* (2013.01); *H05K 2203/0278* (2013.01); *H05K 2203/049* (2013.01); *H05K 2203/107* (2013.01)
(58) Field of Classification Search
    CPC ............... B23K 1/0056; B23K 1/0016; B23K 2201/36–2201/42
    USPC ......... 228/179.1–180.22; 219/121.63–121.66
    See application file for complete search history.

(56) References Cited

U.S. PATENT DOCUMENTS

| | | | | |
|---|---|---|---|---|
| 5,055,652 | A | 10/1991 | Case, Jr. | |
| 5,272,307 | A * | 12/1993 | Jones | B23K 1/0056 219/121.6 |
| 5,730,543 | A * | 3/1998 | Schonauer | C04B 37/023 403/179 |
| 6,723,629 | B2 * | 4/2004 | Hotchkiss | H01L 21/4839 228/180.21 |
| 7,009,142 | B2 * | 3/2006 | Shi | B23K 1/0008 219/121.65 |
| 2003/0019846 | A1 * | 1/2003 | Sinkunas | B23K 1/0056 219/85.13 |
| 2005/0242161 | A1 * | 11/2005 | Shi | B23K 1/0056 228/180.21 |
| 2005/0258153 | A1 * | 11/2005 | Shi | B23K 1/0008 219/121.85 |
| 2007/0193991 | A1 * | 8/2007 | Yamasaki | B23K 1/0056 219/121.85 |
| 2009/0025972 | A1 * | 1/2009 | Nishida | H05K 3/3494 174/263 |
| 2016/0346858 | A1 * | 12/2016 | Shen | B23K 1/0056 |

* cited by examiner

PRINTED CIRCUIT BOARD, METHOD FOR MANUFACTURING PRINTED CIRCUIT BOARD, AND METHOD FOR JOINING CONDUCTIVE MEMBER

TECHNICAL FIELD

The present invention relates to a printed circuit board used for, e.g., a mobile phone and a computer, the method for manufacturing the printed circuit board, and the method for joining a conductive member.

BACKGROUND ART

In recent years, a higher-density circuit board has been developed with size reduction and multi-functionalization of an electronic device. In response, a wire has become extremely thin. Moreover, wires are arranged at an extremely-narrow pitch.

CITATION LIST

Patent Literature

Patent Document 1: Japanese Patent No. 5479432

SUMMARY OF THE INVENTION

Problems to be Solved by the Invention

However, the wire tends to move or deform due to weight reduction as the wire becomes thinner. When such a wire is soldered to a substrate, the wire is lifted away from the substrate. For this reason, soldering cannot be performed. Moreover, when the wires are arranged at the extremely-narrow pitch, a solder bridge is easily caused. Particularly in the case where, e.g., a coaxial cable is manually soldered, the solder bridge is more easily caused.

Thus, the present invention is intended to provide methods and a printed circuit board configured so that even when extremely-thin wires are joined at an extremely-narrow pitch, soldering can be performed with a high yield ratio and a bridge between joint portions can be reduced.

Solutions to the Problems

A method for joining a conductive member according to the present invention includes a placement state holding process of holding a placement state of the conductive member placed on each of a plurality of conductive joint portions with preliminary solders applied thereto in such a manner that the conductive member is covered with an optically-transparent sheet, and a joint process of joining the conductive joint portion and the conductive member together by heating and melting the preliminary solder by light irradiation of the conductive joint portion and the conductive member through the optically-transparent sheet.

Moreover, the method for manufacturing a printed circuit board according to the present invention includes a conductive wire member setting process of placing conductive wire member, a placement state holding process of holding a placement state of the conductive wire member in such a manner that the conductive joint portion and the conductive wire member are covered with an optically-transparent sheet, and the joint process of joining the conductive joint portion and the conductive wire member together by heating and melting a preliminary solder by light irradiation of the conductive joint portion and the conductive wire member through the optically-transparent sheet.

In the above-described method, the placement state of the conductive member (the conductive wire member) on the conductive joint portion is held by the optically-transparent sheet while the preliminary solder is heated and melted by light irradiation. In this manner, the conductive joint portion and the conductive member (the conductive wire member) are joined together. With this configuration, movement and deformation of the easily-movable and easily-deformable thin conductive member (the conductive wire member) can be prevented by coverage with the optically-transparent sheet while the conductive member (the conductive wire member) can contact the conductive joint portion. Thus, the conductive member (the conductive wire member) can be joined to the conductive joint portion with a high yield ratio. Moreover, the preliminary solder for the conductive joint portion is melted. Then, the conductive member (the conductive wire member) is, at a contact surface side, joined to the conductive joint portion with the solder. Consequently, a solder bridge between the conductive joint portions can be reduced as compared to a conventional case of performing the process of using a soldering iron to manually solder the conductive member (the conductive wire member) from above. Thus, short circuit due to the solder bridge can be reduced. Particularly when the pitch between the conductive joint portions is narrow, the frequency of occurrence of the bridge can be significantly reduced.

The optically-transparent sheet is preferably made of polyimide resin.

The strength of the optically-transparent sheet made of polyimide resin can be maintained at a melting temperature at which the preliminary solder is melted. Thus, the placement state of the conductive wire member can be held until completion of soldering.

A printed circuit board of the present invention is a printed circuit board manufactured by the above-described method. A portion of the conductive wire member is preferably exposed. Moreover, an adhesive may be stacked on a portion of the conductive wire member.

Effects of the Invention

According to the present invention, an optically-transparent sheet holds a placement state of a conductive wire member on a conductive joint portion while these portions are soldered together. Thus, soldering can be performed with a high yield ratio even when extremely-thin wires are joined at an extremely-narrow pitch. Moreover, a bridge between the conductive joint portions can be reduced.

DESCRIPTION OF THE EMBODIMENTS

A preferable embodiment of the present invention will be described below with reference to drawings. A printed circuit board, the method for manufacturing the printed circuit board, and the method for joining a conductive member according to a first embodiment of the present invention will be herein described below with reference to FIGS. 1 to 4.

(Printed Circuit Board)

Figure 1:
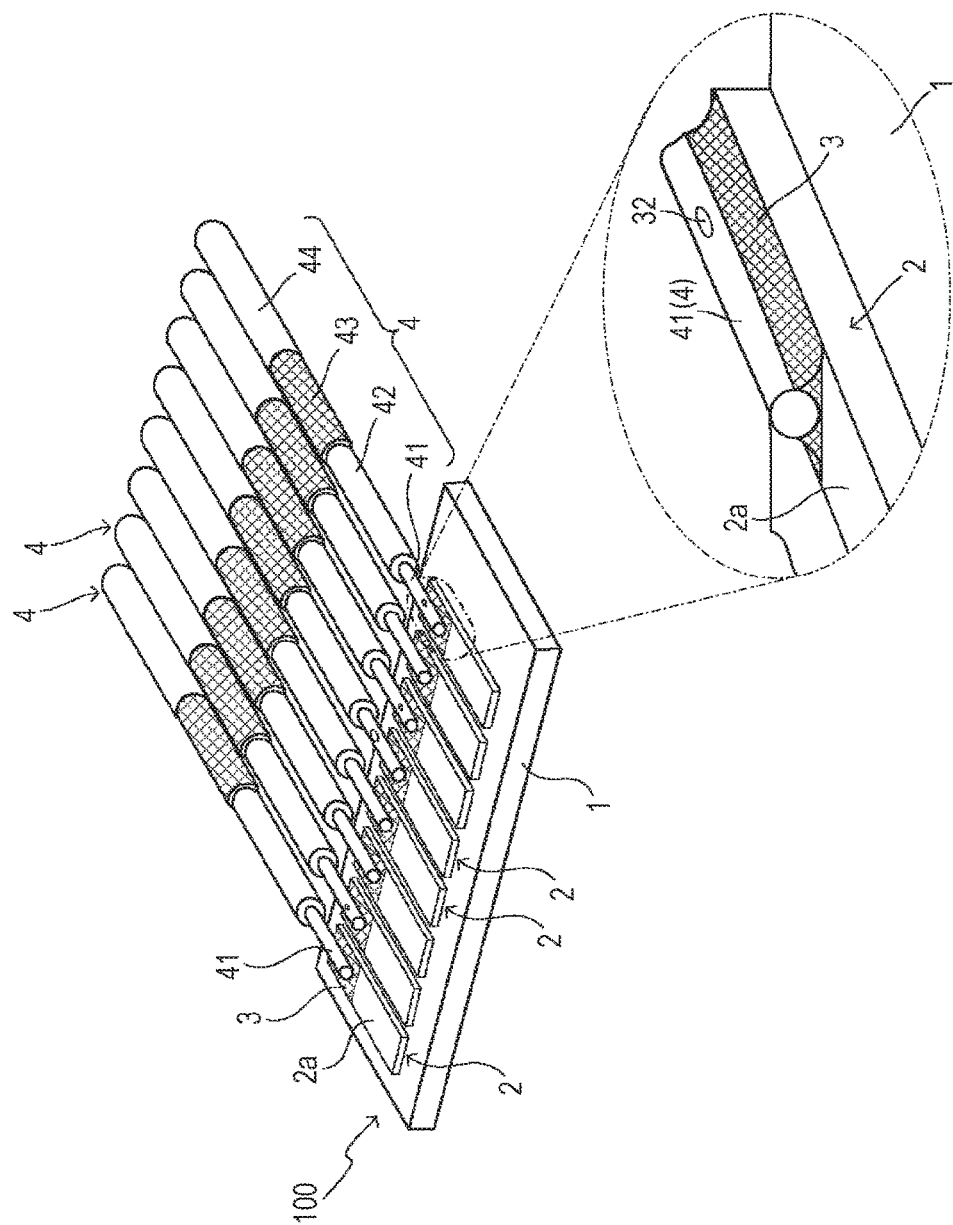
FIG. 1 is a perspective view of a printed circuit board of the present invention.

As illustrated in FIG. 1, a printed circuit board 100 includes a substrate 1 and a plurality of conductive joint portions 2 formed on the substrate 1. Core wires 41 of coaxial cables 4 are, with solders 3, connected respectively onto upper surfaces (joint surfaces) 2a of the conductive joint portions 2.

<Conductive Joint Portion>

The conductive joint portions 2 are arranged at a predetermined pitch. The upper surface 2a of the conductive joint portion 2 is the joint surface joined to the core wire 41 of the coaxial cable 4. The conductive joint portion 2 is formed by, e.g., etching of the substrate 1. Moreover, the conductive joint portion 2 may be formed in such a manner that a conductive material such as silver or copper printed on the substrate 1 is burned. The width of the conductive joint portion 2 is 50 μm to 200 μm, and the pitch of the conductive joint portion 2 is 100 μm to 400 μm, for example. With the conductive joint portion 2 having the above-described width, the core wire 41 can be favorably connected to the conductive joint portion 2. With the conductive joint portions 2 arranged at the above-described pitch, a fillet can be formed in a favorable shape. As a result, the strength of connection between the conductive joint portion 2 and the core wire 41 can be maintained at a predetermined strength.

<Coaxial Cable>

The coaxial cable 4 includes the columnar core wire 41, an internal insulator 42 covering the core wire 41, an external conductor 43 covering the internal insulator 42, and an external insulator 44 as the outermost layer. As illustrated in an enlarged view of FIG. 1, a side peripheral surface of the core wire 41, particularly a lower half surface of the core wire 41, is joined to the upper surface 2a of the conductive joint portion 2 with the solder 3. An upper half surface of the core wire 41 is exposed. A conductive wire member with a diameter of 15 μm to 100 μm can be used as the core wire 41, for example. The pitch of the core wire 41 is 100 μm to 400 μm, for example.

(Method for Manufacturing Printed Circuit Board)

Next, the method for manufacturing the printed circuit board 100 will be described with reference to FIGS. 2A to 2D and FIG. 3.

Figure 2A:
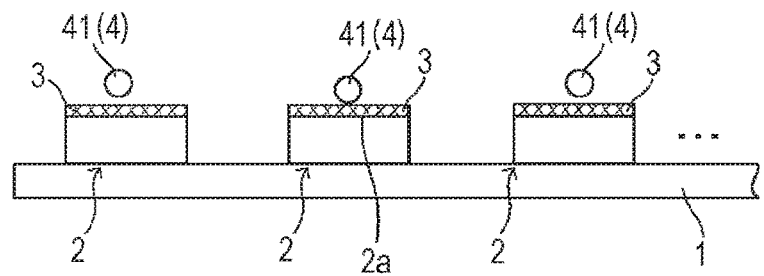
FIG. 2A is a schematic view of a process of placing a core wire on a conductive joint portion.
Figure 3:
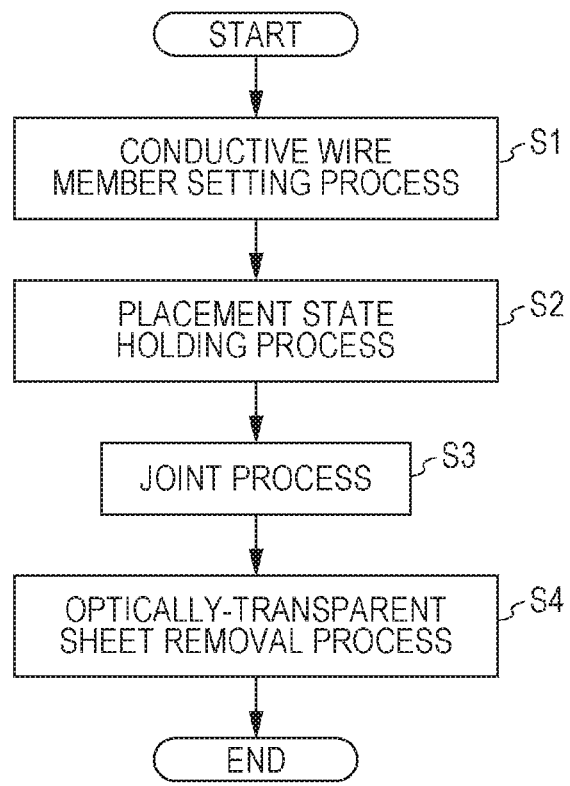
FIG. 3 is a flow chart of a method for manufacturing a printed circuit board.

First, the core wire 41 is placed on the upper surface 2a of the conductive joint portion 2 as illustrated in FIG. 2A (a conductive wire member setting process at S1 of FIG. 3). The solder 3 is applied in advance onto the upper surface (the joint surface) 2a of the conductive joint portion 2. The solder 3 is applied to the entire upper surface 2a. When the core wire 41 is thin and lightweight, such a core wire 41 is easily deformable or movable. For this reason, the core wire 41 is sometimes lifted away from the upper surface 2a of the conductive joint portion 2 (see the right and left core wires 41 of FIG. 2A).

Figure 2B:
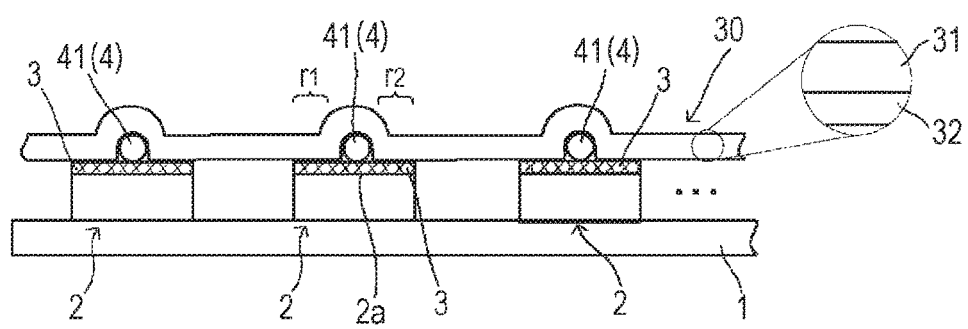
FIG. 2B is a schematic view of a process of holding a placement state of the core wire by an optically-transparent sheet.

For this reason, the conductive joint portions 2, the solders 3, and the core wires 41 are covered with an optically-transparent sheet 30 (see FIG. 2B). In this state, the core wires 41 and the solders 3 are covered with the optically-transparent sheet 30 such that the core wires 41 contact the solders 3 and that the core wires 41 do not deform or move. In FIG. 2B, the upper half of the side peripheral surface of the core wire 41 is covered with the optically-transparent sheet 30. Moreover, regions r1, r2 of the solder 3 on both sides of the core wire 41 are covered with the optically-transparent sheet 30. With this configuration, the state in which the core wire 41 is placed on the conductive joint portion 2 can be held such that the core wire 41 does not deform and move not only in an upper-to-lower direction but also in a right-to-left direction (a placement state holding process at S2 of FIG. 3).

The optically-transparent sheet 30 includes a resin layer 31 made of polyimide, and an adhesive layer 32 formed below the resin layer 31 (see an enlarged view of FIG. 2B). The optically-transparent sheet 30 is, with the adhesive layer 32, bonded to the core wires 41 and the solder 3.

Note that an optically-transparent member may be placed only on the core wires 41. However, when the core wire 41 is thin and lightweight, such a core wire 41 tends to move or deform right and left to a non-contact state with the conductive joint portion 2. Moreover, the upper surface 2a of the conductive joint portion 2 tends to be raised in a curved shape. For these reasons, when the optically-transparent member is placed on the columnar core wires 41 placed on such upper surfaces 2a, the core wires 41 move or deform. Thus, in the present embodiment, the upper surface of the core wire 41 and the solder 3 (the regions r1, r2) on both sides of the core wire 41 are covered with the optically-transparent sheet 30. With this configuration, the state in which the core wire 41 is placed on the conductive joint portion 2 can be held while movement and deformation of the core wire 41 can be reduced.

Figure 2C:
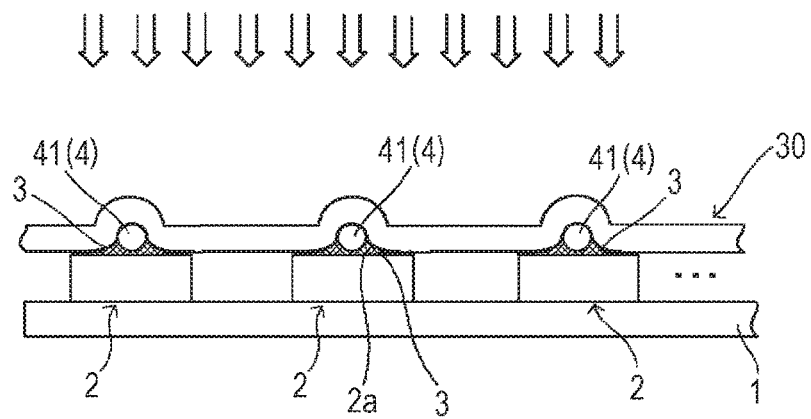
FIG. 2C is a schematic view of a process of joining the core wire and the conductive joint portion together.

Next, the conductive joint portions 2 and the core wires 41 are irradiated with light through the optically-transparent sheet 30 (see FIG. 2C). That is, the solders 3 and the core wires 41 are irradiated with the light transmitted through the optically-transparent sheet 30, and in this manner, the solders 3 are melted by light energy. The light energy used for irradiation of the core wires 41 is also transmitted to the solders 3 below the core wires 41, thereby melting the solders 3. With this configuration, the core wire 41 is, with the solder 3, joined to the conductive joint portion 2 (a joint process at S3 of FIG. 3). For example, laser light or infrared light may be irradiated as light. Subsequently, the optically-transparent sheet 30 is removed (see FIG. 2D), and in this manner, a connection structure of the present embodiment is provided (an optically-transparent sheet removal process at S4 of FIG. 3).

Figure 2D:
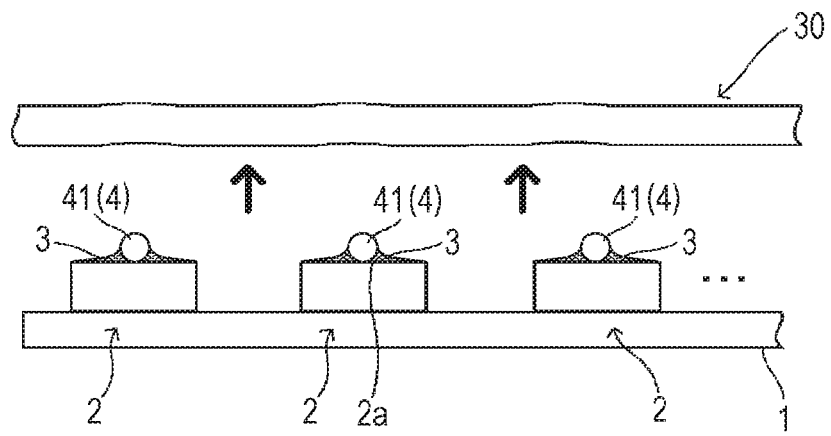
FIG. 2D is a schematic view of a process of removing the optically-transparent sheet.

As illustrated in FIG. 2D, the lower half of the side peripheral surface of the core wire 41 is soldered to the conductive joint portion 2. On the other hand, the upper half of the side peripheral surface of the core wire 41 is exposed. A partially-remaining portion (an adhesive) of the adhesive layer 32 of the optically-transparent sheet 30 might be stacked on such an exposed surface (see FIG. 1).

As described above, the connection structure of the core wire of the coaxial cable of the present embodiment provides the following advantageous effects.

In the present embodiment, the conductive joint portion 2 and the core wire 41 are joined together in such a manner that preliminary solder is irradiated with light while the placement state of the core wire 41 on the conductive joint portion 2 is held by the optically-transparent sheet 30. In the case of using extremely-thin core wires 41, these core wires 41 are lightweight, and therefore, are easily movable or deformable. However, since the core wires 41 are covered with the optically-transparent sheet 30, movement and deformation of the core wires 41 are prevented, and therefore, the core wire 41 can contact the conductive joint portion 2. Thus, the core wire 41 can be joined to the conductive joint portion 2 with a high yield ratio. The preliminary solder for the conductive joint portions 2 is melted. Thus, the core wire 41 is, from a contact surface side, joined to the conductive joint portion 2 with the solder. Consequently, a solder bridge between the conductive joint portions 2 can be reduced as compared to a conventional case of performing the process of using a soldering iron to manually solder the core wires 41 from above. Thus, short circuit due to the solder bridge can be reduced. Particularly when the pitch between the conductive joint portions 2 is narrow, the frequency of occurrence of the bridge can be significantly reduced.

Moreover, in the present embodiment, the resin layer 31 made of polyimide resin is used for the optically-transparent sheet 30. The strength of the resin layer 31 can be maintained at a melting temperature at which the preliminary solder is melted. Thus, the placement state of the core wire 41 can be held until completion of soldering.

Further, the above-described conductive wire member setting process includes, for example, a method in which conductive wire members aligned at a pitch corresponding to a spacing between adjacent ones of conductive joint portions are placed respectively on the conductive joint portions.

The embodiment of the present invention has been described above with reference to the drawings. Note that a specific configuration of the embodiment of the present invention is not limited to the above-described embodiment. The scope of the present invention is not defined by description made above, but by the range of the appended claims. Further, all variations and equivalents which fall within the range of the appended claims are intended to be embraced therein.

Figure 4:
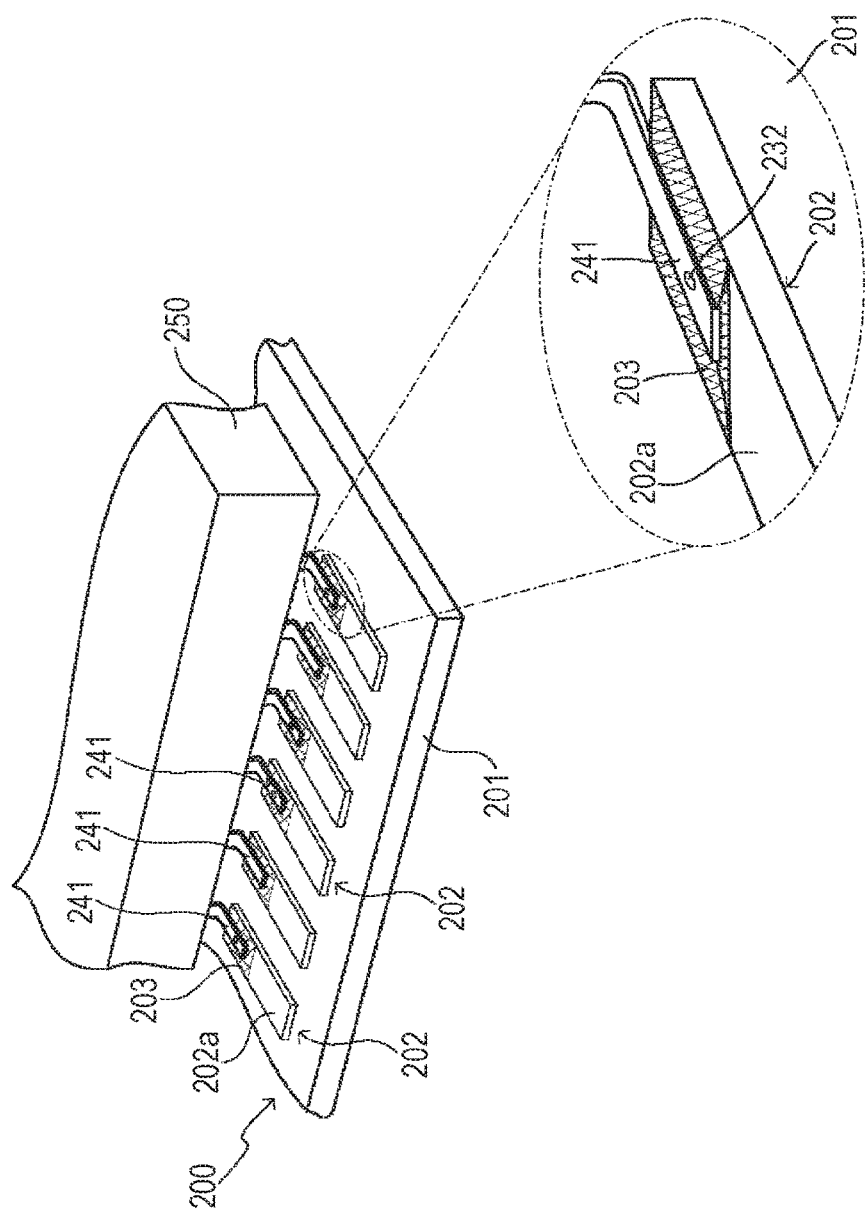
FIG. 4 is a perspective view of a printed circuit board of a variation.

For example, the coaxial cable is used as the conductive wire member in the above-described embodiment. Note that other conductive members or conductive wire members than the coaxial cable may be used. For example, the above-described method may be employed when a flat cable is connected to a substrate. Alternatively, the above-described joint method may be employed when a connector is joined to a substrate. As illustrated in FIG. 4, the above-described method can be employed when a terminal (a conductive member) 241 attached to a connector housing 250 is joined to a conductive joint portion 202 formed on a substrate 201. In this case, a preliminary solder 203 is, as in the above-described method (see FIGS. 2A to 2D), applied to an upper surface (a joint surface) 202a of the conductive joint portion 202. Then, the terminal 241 is placed on the preliminary solder 203. Subsequently, the terminals 241, the solder 203, and the conductive joint portions 202 are covered with an optically-transparent sheet (a placement state holding process). In this state, irradiation is performed using light. Then, the optically-transparent sheet is removed, and as a result, a printed circuit board 200 illustrated in FIG. 4 is provided (a joint process). An upper surface of the terminal 241 is exposed. When the method of the present invention is employed, soldering can be performed with a high yield ratio even in the case of joining extremely-thin terminals at an extremely-narrow pitch. Moreover, core wires can be arranged at an extremely-narrower pitch as compared to the conventional case. Even with such a pitch, a bridge between the conductive joint portions can be reduced. Note that an adhesive layer 232 of the optically-transparent sheet may be partially stacked on the exposed surface of the terminal 241. Moreover, other connectors connected to coaxial cables may be attached to the connector housing 250.

In the above-described embodiment, polyimide resin is used for the resin layer of the optically-transparent sheet. Note that other types of resin may be used as long as such resin has a higher melting point than that of the solder and light can be transmitted through the resin.

Moreover, in the above-described embodiment, the solder is applied to the entire width of the upper surface 2a of the conductive joint portion 2. Note that a portion of the upper surface 2a may be exposed such that the solder is applied only to the vicinity of the center of the width of the upper surface 2a of the conductive joint portion 2. In this case, the optically-transparent sheet 30 is, at the placement state holding process illustrated in FIG. 2B, preferably bonded to the upper half of the side peripheral surface of the core wire 41, the exposed portion of the solder 3, and the exposed portion of the upper surface 2a of the conductive joint portion 2. With this configuration, the state in which the core wire 41 is placed on the conductive joint portion 2 can be more reliably held.

Further, after removal of the optically-transparent sheet 30, a portion (the adhesive) of the adhesive layer 32 may be stacked on the exposed surface of the core wire 41. Note that the adhesive layer 32 is not necessarily stacked on the core wire 41.

LIST OF REFERENCE NUMERALS 1, 201 Substrate
2, 202 Conductive joint portion
2a, 202a Upper surface (joint surface)
3, 203 Solder
4 Coaxial cable
30 Optically-transparent sheet
31 Resin layer
32, 232 Adhesive layer
41 Core wire (Conductive member, Conductive wire member)
100, 200 Printed circuit board
241 Terminal (Conductive member)

The invention claimed is:

1. A method for joining a conductive member, comprising:
a placement state holding process of holding a placement state of the conductive member in such a manner that an upper surface of the conductive member placed on each of a plurality of conductive joint portions to which preliminary solder is applied and the preliminary solder are covered with an optically-transparent sheet having an adhesive layer, the upper surface of the conductive member and the preliminary solder being in direct contact with the optically-transparent sheet; and
a joint process of joining the conductive joint portion and the conductive member together by heating and melting the preliminary solder by light irradiation of the conductive joint portion and the conductive member through the optically-transparent sheet.

2. A method for manufacturing a printed circuit board, comprising:
a conductive member setting process of placing a conductive member on each of a plurality of conductive joint portions to which preliminary solder is applied;

a placement state holding process of holding a placement state of the conductive member in such a manner that an upper surface of the conductive member and the preliminary solder are covered with an optically-transparent sheet having an adhesive layer, the upper surface of the conductive member and the preliminary solder being in direct contact with the optically-transparent sheet; and a joint process of joining the conductive joint portion and the conductive member together by heating and melting the preliminary solder by light irradiation of the conductive joint portion and the conductive member through the optically-transparent sheet.

3. The method for manufacturing the printed circuit board according to claim 2, wherein the optically-transparent sheet is made of polyimide resin.

4. The method for manufacturing the printed circuit board according to claim 2, further comprising:

an optically-transparent sheet removal process of removing the optically-transparent sheet after the joint process, wherein a portion of the conductive member is exposed at the optically-transparent sheet removal process.

5. The method for manufacturing the printed circuit board according to claim 3, further comprising:

an optically-transparent sheet removal process of removing the optically-transparent sheet after the joint process, wherein a portion of the conductive member is exposed at the optically-transparent sheet removal process.

6. The method for joining a conductive member according to claim 1, wherein at the placement state holding process, the upper surface of the conductive member and regions of the preliminary solder on both sides of the conductive member are in direct contact with the optically-transparent sheet.

7. The method for joining a conductive member according to claim 1, wherein at the placement state holding process, the conductive member is placed between regions of the preliminary solder, and the upper surface of the conductive member and the regions of the preliminary solder are in direct contact with the optically-transparent sheet.

8. The method for manufacturing the printed circuit board according to claim 2, wherein at the placement state holding process, the upper surface of the conductive member and regions of the preliminary solder on both sides of the conductive member are in direct contact with the optically-transparent sheet.

9. The method for manufacturing the printed circuit board according to claim 2, wherein at the conductive member setting process, the conductive member is placed between regions of the preliminary solder, and at the placement state holding process, the upper surface of the conductive member and the regions of the preliminary solder are in direct contact with the optically-transparent sheet.

* * * * *